(12) United States Patent
Kvavle et al.

(10) Patent No.: US 8,611,759 B1
(45) Date of Patent: Dec. 17, 2013

(54) OPTICAL DOMAIN WIDEBAND RF SPECTRUM ANALYZER/CHANNELIZER BASED ON THIRD-ORDER NONLINEAR MIXING

(75) Inventors: Joshua M. Kvavle, San Diego, CA (US); James R Adleman, San Diego, CA (US); Christopher K. Huynh, Rosemead, CA (US); Camille-Sophie Bres, Lausanne (CH); Sanja Zlatanovic, San Diego, CA (US); Andreas Olof Johan Wiberg, La Jolla, CA (US); Ping Piu Kuo, San Diego, CA (US); Evgeny Myslivets, San Diego, CA (US); Everett William Jacobs, San Diego, CA (US); Stojan Radic, La Jolla, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 59 days.

(21) Appl. No.: 13/368,041

(22) Filed: Feb. 7, 2012

(51) Int. Cl.
*H04B 10/04* (2011.01)
*H04B 10/00* (2013.01)
*H04J 14/02* (2006.01)

(52) U.S. Cl.
USPC ............. 398/182; 398/115; 398/116; 398/85; 398/82

(58) Field of Classification Search
USPC .................. 398/182, 115, 116, 82, 85, 79
See application file for complete search history.

(56) References Cited

U.S. PATENT DOCUMENTS

| | | | | | |
|---|---|---|---|---|---|
| 5,210,631 | A | * | 5/1993 | Huber et al. | 398/186 |
| 5,963,567 | A | * | 10/1999 | Veselka et al. | 372/21 |
| 6,879,433 | B1 | * | 4/2005 | Yamashita et al. | 359/332 |
| 7,068,943 | B2 | * | 6/2006 | Korolev et al. | 398/148 |
| 7,164,526 | B2 | * | 1/2007 | McKinstrie et al. | 359/330 |
| 7,245,833 | B1 | * | 7/2007 | Volkening | 398/116 |
| 8,275,263 | B1 | * | 9/2012 | Franklin | 398/92 |
| 2003/0026527 | A1 | * | 2/2003 | Takahashi et al. | 385/24 |
| 2004/0184815 | A1 | * | 9/2004 | Korolev et al. | 398/148 |
| 2007/0206950 | A1 | * | 9/2007 | Liu et al. | 398/115 |
| 2010/0284431 | A1 | * | 11/2010 | Inoue | 372/32 |

* cited by examiner

*Primary Examiner* — M. R. Sedighian
*Assistant Examiner* — Abbas H Alagheband
(74) *Attorney, Agent, or Firm* — Kyle Eppele; Peter A. Lipovsky (57) ABSTRACT

An optical domain spectrum analyzer/channelizer employs multicasting of an analog signal onto a wavelength division multiplexing grid, followed by spectral slicing using a periodic optical domain filter. This technique allows for a large number of high resolution channels. Wideband, 100% duty cycle, spectrum analysis or channelization is made possible permitting continuous time wideband spectral monitoring. The instantaneous bandwidth of the spectrum analyzer/channelizer is equal to the full radio frequency bandwidth of the analyzer/channelizer.

15 Claims, 6 Drawing Sheets

OPTICAL DOMAIN WIDEBAND RF SPECTRUM ANALYZER/CHANNELIZER BASED ON THIRD-ORDER NONLINEAR MIXING

FEDERALLY-SPONSORED RESEARCH AND DEVELOPMENT

The United States Government has certain rights in this invention. Licensing inquiries may be directed to Office of Research and Technical Applications, Space and Naval Warfare Systems Center, Pacific, Code 72120, San Diego, Calif., 92152; telephone 619-553-2778; email: T2@spawar.navy.mil. Please reference Navy Case No. 101250.

BACKGROUND

Electrical and optical techniques have been applied to wideband radio frequency (RF) spectrum analysis/channelization.

A conventional electrical domain RF channelization technique employs a bank of narrowly spaced filters. For wideband applications where relatively high instantaneous bandwidth (IBW) is sought (i.e. a significant number of channels), designs become difficult to tune, bulky and expensive. An alternative electrical domain method of wideband channelization uses a high speed analog-to-digital converter (ADC) followed by a Fast Fourier Transform (FFT).

Though progress has been made in increasing ADC IBW, current ADC IBWs are inadequate to monitor the entire RF spectrum, where tens of gigahertz bandwidth is required. When the frequency range of interest is greater than the ADC IBW, the full frequency range can still be analyzed by appropriate splitting, filtering, amplifying, down conversion and digitization of the resulting multiple channels. This approach however suffers from increased size, weight, and power requirements.

Because of the limitations of the electrical domain methods, several optical domain RF spectrum analyzer/channelization approaches have been proposed. One highly studied approach employs an incoherent transversal filter. This design implements necessary negative filter coefficients, but this adds complexity to the design. There are also attendant performance degrading coherent effects that must be mitigated with this design.

The coherent transversal filter approach offers the possibility of excellent channelization performance and this approach is in fact commonly used in integrated devices for channel spacing relevant to wavelength division multiplexed optical networks, i.e., >25 GHz. For channel spacing relevant to RF applications, however, the required delay times are longer and therefore the tuning and stability of devices using the coherent approach become increasingly difficult.

Other optical domain RF channelization approaches exist such as described in R. K. Mohan, et al., "Ultra-wideband spectral analysis using S2 technology" Journal of Luminescence 127, 116 (2007) and M. Stead, "Using Dispersion in a Fiber-Optic Loop to Perform Time Domain Analogue RF Signal Auto-Correlation," in Optical Fiber Communication Conference, OSA Technical Digest (CD) (Optical Society of America, 2011), paper OThW3.

SUMMARY

An optical domain spectrum analyzer/channelizer employs multicasting of an analog signal onto a wavelength division multiplexing (WDM) grid, followed by spectral slicing using a periodic optical domain filter. This technique allows for a large number of high resolution channels. Wideband, 100% duty cycle, spectrum analysis or channelization is made possible permitting continuous time wideband spectral monitoring. The IBW of the spectrum analyzer/channelizer is equal to the full RF bandwidth of the analyzer/channelizer.

DETAILED DESCRIPTION

Figure 1:
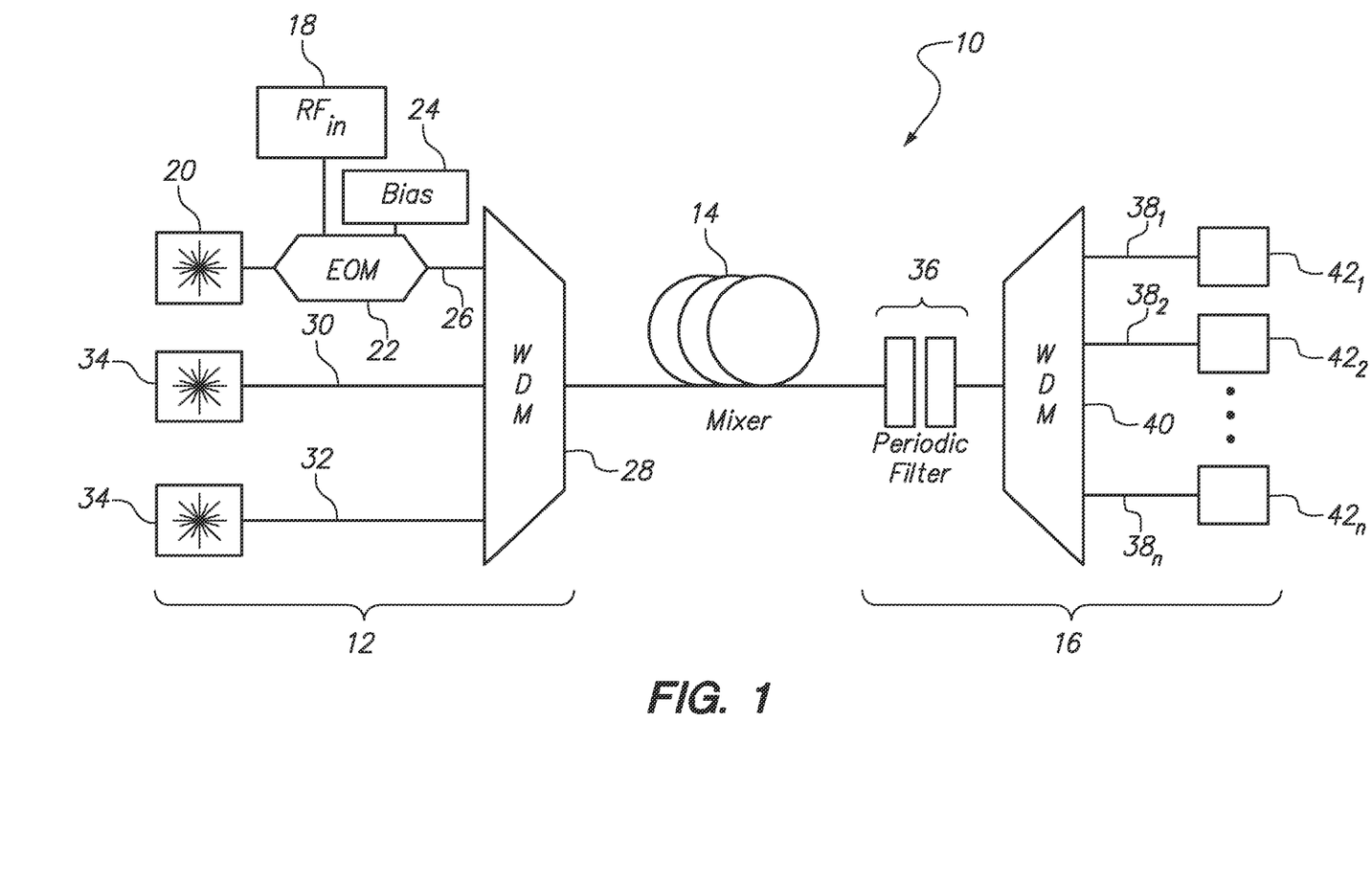
FIG. 1 illustrates a general approach to an analyzer/channelizer according to an exemplary embodiment as described herein.

Referring now to FIG. 1, there is a shown a general approach to an optical domain spectrum analyzer/channelizer system 10 according to the description herein. System 10 includes an operation that can be broken down into three stages including a processor front-end stage 12, a mixing stage 14 and a processor back-end stage 16. Theses stages will initially be described in terms of their processing functions and will be later be described by way of example.

Front-end stage 12 modulates an RF signal of interest 18 onto an optical signal laser carrier 20 via an electro-optical modulator 22 that is null-biased 24, thereby generating RF modulated signal laser carrier signal 26. Signal 26 is spectrally combined with two continuous wave (CW) amplified low noise laser inputs 30 and 42 (from source 34) in multiplexer 28 to thereby pump a parametric mixing process.

Figure 2:
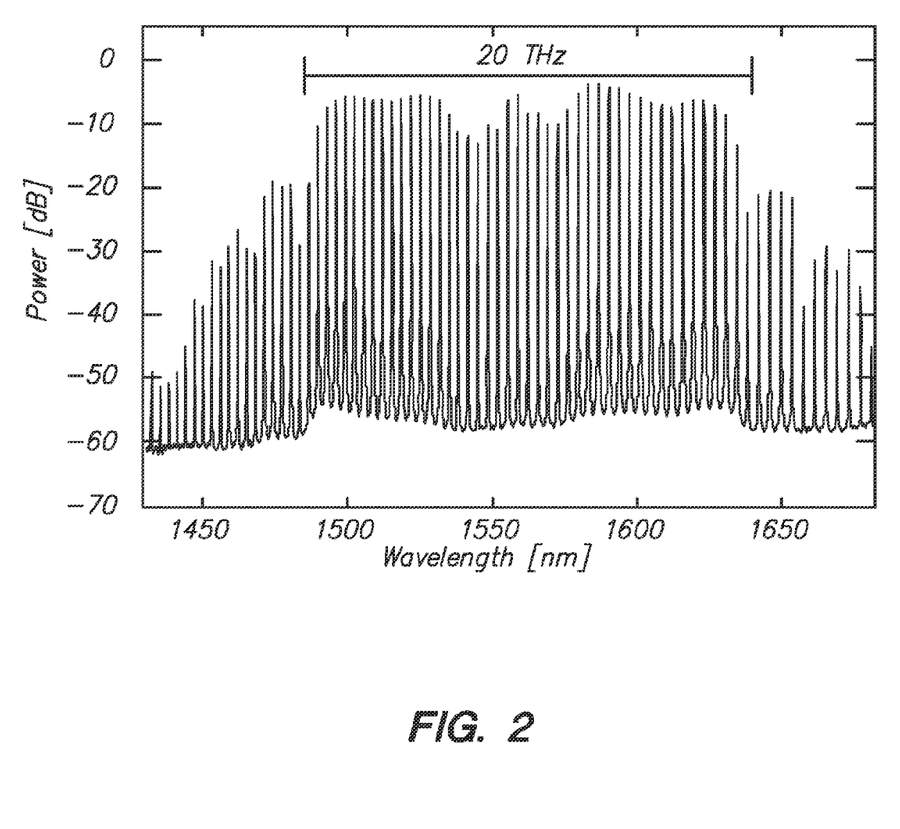
FIG. 2 is a graph showing pump copies as produced via four-wave mixing in accordance with an embodiment shown herein.
Figure 3:
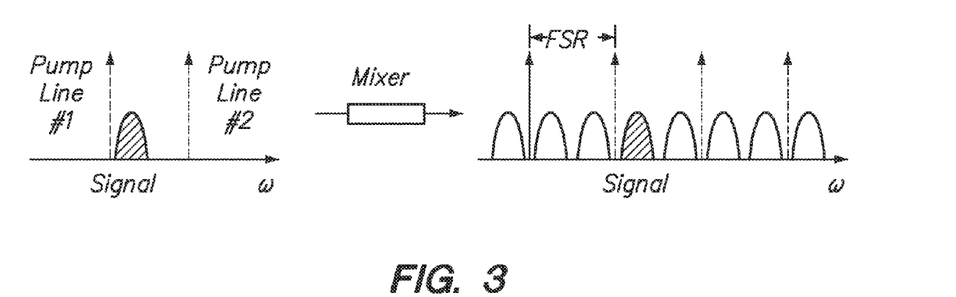
FIG. 3 illustrates pump and signal replication according to an embodiment shown herein.

Mixing stage 14 performs a multicasting operation, creating a comb of copies of the pump lasers and of the signal laser. FIG. 2 depicts experiment data of the optical spectrum of the pump laser comb of copies. Third-order nonlinear processes enable mixing between the two original pump lines and serves to create the pump laser comb of copies, with a period equal to the frequency differences between the two pump lines. FIG. 3 illustrates how third-order nonlinear processes result in mixing of the signal laser with the pump lines, thereby creating a signal laser comb of copies. The signal laser comb position and the signal laser comb free spectral range (FSR) can be arbitrarily selected by tuning the frequency of the three laser sources. Third order nonlinear processes can be any one or a multitude of different phenomena such as four-wave mixing, self-phase modulation and cross phase modulation.

Referring again to FIG. 1, back-end processing stage 16 performs signal segregation for use in spectral analysis or channelization. A narrow-band periodic filter 36 slices a narrow band or frequency bin out of each copy of the RF modulated signal laser comb of copies. The output of mixer 14 is tuned so that the FSR of the signal comb differs from the period of the narrow-band periodic filter by the filter's passband width. Each slice is routed to a separate optical channel 38 by a wave division demultiplexer 40. Element 42 is either a photodetector when system 10 is used as a spectrum analyzer, or is a signal combiner wherein the separate optical channel is heterodyned with an optical carrier so that information on each channel can be extracted.

The Vernier relationship between the array of multicast signals and the narrow band filter passband ensures that the RF selected spectral bins are adjacent and non-overlapping. The filter's pass band position can be tuned so that the longest wavelength channel contains the lowest RF frequency bin of interest. This enforces a one to one mapping of RF bins to detection elements 42, channelizing the entire RF frequency range without repetition.

Figure 4:
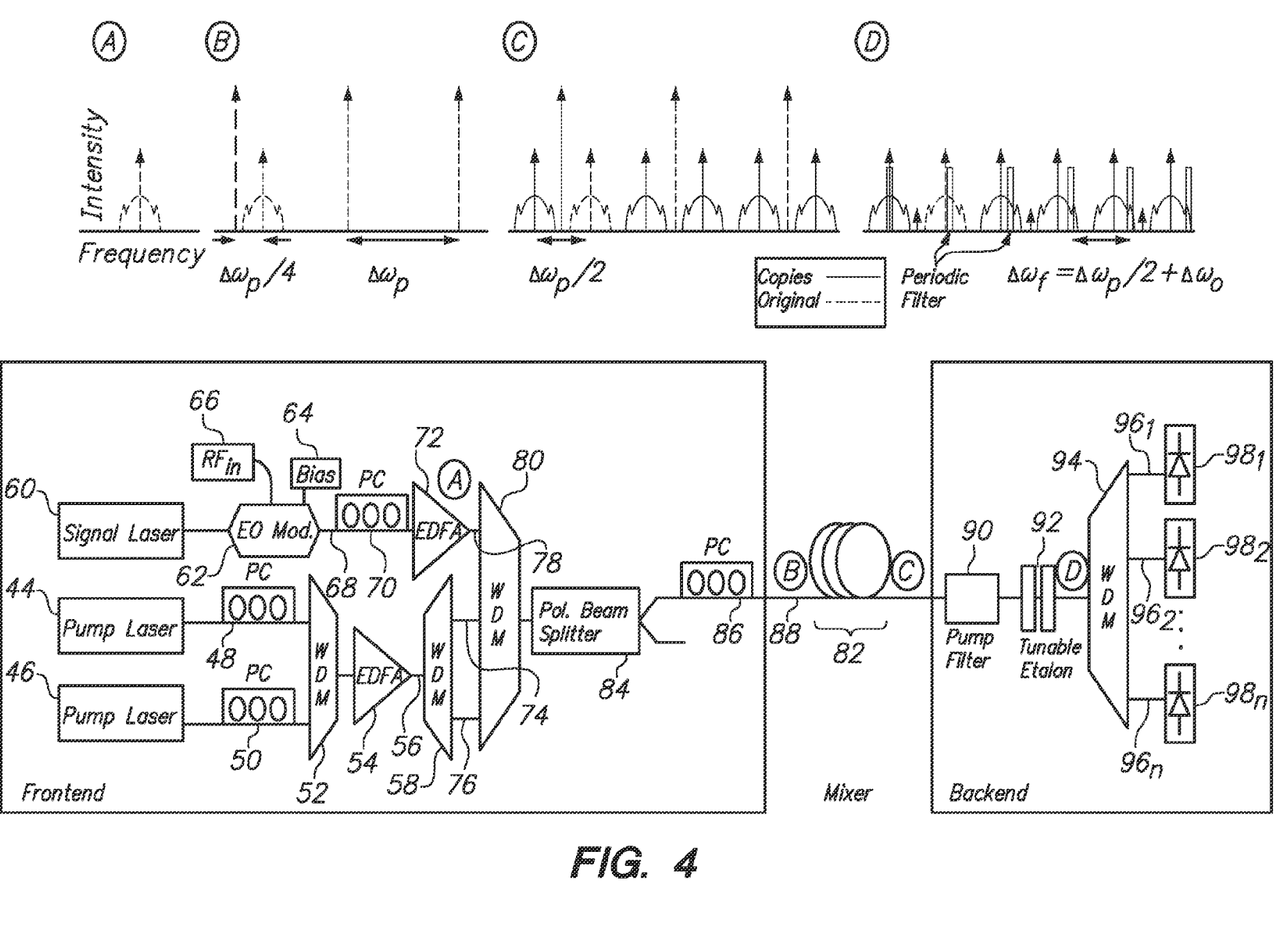
FIG. 4 illustrates a detailed approach to an analyzer/channelizer according to an exemplary embodiment according to the description herein.

Referring now to FIG. 4, there is shown a specific embodiment of the analyzer/channelizer presented by way of example.

In FIG. 4, two pump lasers 44 and 46, spaced by $\Delta\omega_p$=200 GHz, are first appropriately polarization controlled (48, 50) and are then combined in multiplexer 52. The output of the multiplexer is boosted in an optical amplifier 54 such as an Erbium doped fiber amplifier (EDFA) to reach a 1 Watt optical power at the mixer input as the system is set up to operate between about 1 and 2 Watts at the mixer. The boosted multiplexer 52 output 56 is then spectrally separated in demultiplexer 58 to filter amplified spontaneous emission noise added by optical amplifier 54.

A separate signal laser 60 is input into an electro-optic modulator 62 which is null biased 64. The RF content 66 to be analyzed is input into modulator 62, creating sidebands which contain the RF information (FIG. 4A). The RF modulated signal laser signal 68 is appropriately polarized 70 and amplified 72 for further processing.

Pump laser inputs (74, 76) and the RF modulated signal laser input are combined in a multiplexer 80, such as a commercial off-the-shelf (COTS) ITU grid. Note that the signal laser is spaced $\Delta\omega_p$/4=50 GHz away from a pump copy (FIG. 4B). Prior to the signal and pumps being input into mixer 82, polarization beam splitter 84 and polarization controller 86 condition front-end multiplexed output signal 88 so that the polarization of output signal 88 is collinear and aligned to the optimal polarization of the mixer.

Mixing stage 82 has, as its purpose, the function of making copies of the pumps and signal and in effect generates a pump laser comb of copies and a modulated signal laser comb of copies. The signal copy spacing is in this instance $\Delta\omega_p$/2=100 GHz. An elaboration of this mixing stage will follow; however, at this juncture of the description, the further processing of the copied signals will be described.

The analyzer/channelizer processor back-end begins with a filter 90 designed to attenuate the pump laser comb of copies. Following filter 90 is a narrow-band periodic filter 92 such as a tunable Fabry-Perot etalon. Filter 92 is set up with a passband $\Delta\omega_0$=250 MHz and a passband spacing of $\Delta\omega_f=\Delta\omega_p/2+\Delta\omega_0$=100.25 GHz so as to filter out one designated RF bin per signal copy. The etalon filtered output is then de-multiplexed with a standard dense WDM 94 like WDM 80. The output optical channels 96 are further processed in detector elements 98, either to measure output power for spectral analyzing purposes (such as via photo detectors) or are heterodyned with an optical carrier signal so that information can be extracted from each channel as present (as a channelizer). Alternatively, information contained in a subcarrier can be extracted. This approach is possible when the subcarrier and its sidebands are fully contained within one narrowband filter passband.

With 72 signal copies and a 250 MHz passband for each copy, the example implementation described covers a total IBW of 18 GHZ. This 18 GHz band can be positioned, for example, to cover the 2-20 GHz frequency range. This technology can also be used to cover a 100 GHz IBW by generating 100 copies of the signal and filtering these copies with a 1 GHz periodic filter passband. If a smaller resolution bandwidth is desired, this technology can also be used to cover a smaller frequency range, for example, with 100 copies covering a 1 GHz IBW. Channels with a 10 MHz resolution can be obtained with an appropriate etalon.

Figure 5:
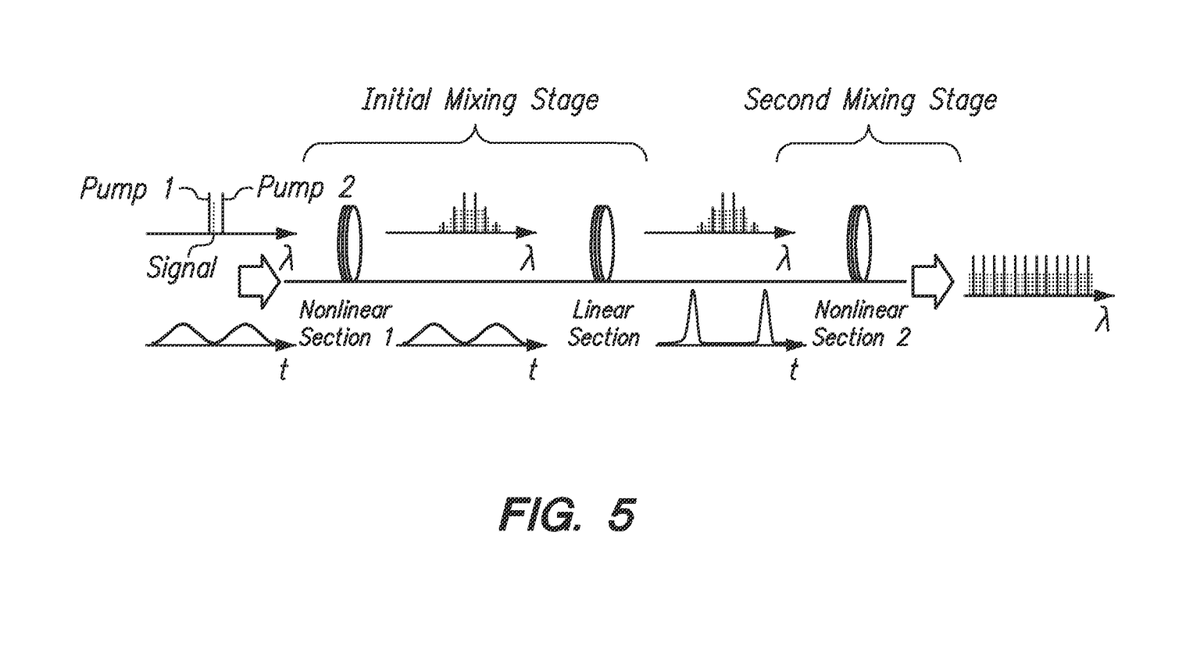
FIG. 5 is a detailed description of a mixing function in accordance with an embodiment described herein.

Referring now to FIG. 5, there is shown a detailed description of mixer 82 of FIG. 4.

Higher-order mixing has been investigated before, but is deemed impractical so far to reach high-copy-count due to the excessively high power needed to spawn a large number of higher-order pumps. Further, the use of intense pumps can lead to severe noise generation through Raman/Brillouin scattering and parametric fluorescence, thereby degrading the signal and copy quality.

Recognizing the problem associated with higher-order pump generation, the mixing processing of this description is designed to reduce pump power. It does so by utilizing precise, staged engineering of the mixer dispersion profile. This design is to enable power-efficient broadband mixing without resorting to excessive counter-productive pump levels.

The underlying principle of the mixing process will be described by considering the pump-pump interaction only, though FIG. 5 illustrates pump and signal generation (signal shown dotted in the illustration). The dispersion-engineered mixer can be segmented into two stages, an initial stage corresponding to a seeding/compression function and a secondary stage focused on multi-casting.

Two pump waves, for example 1555.6 nm at 29.6 dBm power and 1559 nm at 29 dBm power, respectively, are first launched into the initial stage, which includes a highly-nonlinear fiber (HNLF) and a dispersive linear fiber sections. The pump waves interact along the nonlinear fiber section via third order nonlinear processes, such as four-wave mixing (FWM) to generate new optical tones. This nonlinear generation process can also be viewed as a nonlinear phase rotation induced by the intensity undulation in the time domain, inherited from the coherent beating between the two pump seeds. When the resultant chirped optical field propagates in a dispersive medium (linear section) possessing positive chromatic dispersion, the sinusoidal intensity profile will be compressed, thereby forming short pulses with considerable enhancement in peak power. Enhancements in spectral span and peak power in this compression stage facilitate efficient generation of higher-order pump tones in the subsequent stage, as it has been shown that the strength of nonlinear interaction scales with the peak intensity and the spectral span of the optical field.

Following the pulse compression generated in the linear section of the initial mixing stage, an efficient higher-order mixing occurs in the secondary mixing stage. When the pulses from the initial stage propagate in HNLF of the secondary stage, the optical field will experience extensive spectral broadening due to third-order nonlinear processes, such as self-phase modulation. The spectral broadening of the pulse train is equivalent to the creation of a comb of optical tones, with the frequency spacing defined by the pump-pump frequency separation. In the presence of the signal, higher-order pump generation simultaneously leads to spawning of multiple frequency-non-degenerate signal copies, where each pump wave creates two copies through sideband generation processes.

The first section (Nonlinear Section 1) used was a 100-meter HNLF which gave the initial chirping of the optical field. The fiber was characterized by a (global) zero-dispersion wavelength (ZDW) of 1552 nm, a dispersion slope of 0.028 ps/nm/km and a nonlinear coefficient of 12 W km. A longitudinal differential stress was applied to raise the stimulated Brillouin scattering (SBS) threshold beyond 30 dBm, thus eliminating the need for pump phase dithering. Following the initial chirping, the output from the first nonlinear section underwent linear temporal compression in a standard single-mode fiber (SMF), shown as the "Linear Section:" in the FIG. 5. The total length of SMF, including the pigtails for interfacing the mixer stages, was 7 m. An exceedingly efficient higher-order mixing was then accomplished in the subsequent HNLF section (Nonlinear Section 2).

The pump power budget imposes requirements with respect to the mixer design. First, the employed pump power defines the pulse compressor design. In addition, the output of the initial stage then needs to be matched by the chromatic dispersion in the secondary stage to accomplish the large bandwidth and maintain spectral flatness of the mixing process. The 200-m dispersion-flattened HNLF used in the secondary stage was selected to satisfy these requirements: it possessed low dispersion ($|D|<1$ ps/nm/km) over the 1500-1650-nm band, allowing for uniform and efficient mixing. Furthermore, the concave parabolic dispersion profile with very low peak dispersion ($D<0.3$ ps/nm/km) helped quench the noise generation induced by the modulation instability (MI), and flattening the spectrum by shock formation in the normal dispersion regime.

Figure 6:
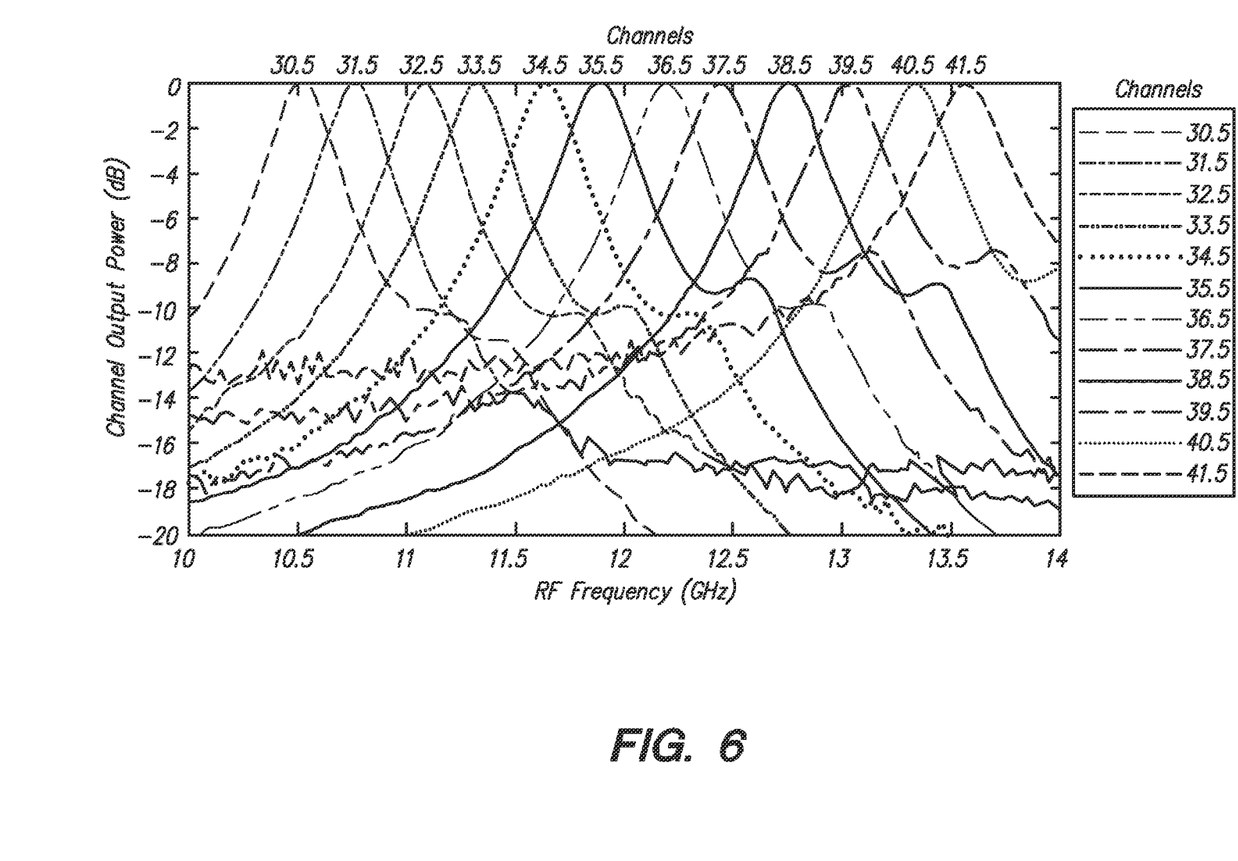
FIG. 6 is a graph depicting experiment data from an analyzer/channelizer having 10 GHz to 14 Ghz and of 10 optical channels.

FIG. 6 plots example data corresponding to a 12 channel spectrum analyzer covering the RF frequency range from 10 to 14 GHz utilizing the 193.05 to 194.15 THz optical band.

The relative frequencies of the pumps and signal laser as well as the bandwidth of the periodic optical filter define the IBW and RBW of this invention. By simply changing pump and signal frequencies, and by changing the bandwidth of the optical filter, this invention can be modified on the fly.

In some of the configurations of this invention when an optical amplifier (e.g., an EDFA) is used to boost the pump power to a required level for efficient four-photon mixing to occur, any amplified spontaneous transmission can be filtered before being transmitted into the nonlinear fiber.

The EOM used can be a phase modulator, an intensity modulator (e.g., a Mach Zehnder modulator), and the modulator can be biased at quadrature or it can be biased to suppress the optical carrier. Use of a phase modulator has the advantage of fixed optical power operation of the parametric mixer, while suppressed carrier operation has the advantage of relaxation of system filtering design.

While low-order mixing is performed in the initial mixing stage described herein and higher order mixing is performed in the secondary mixing stage described herein, additional mixing stages can be implemented where enhanced resolution is desired. Such additional mixing stages could be incorporated as linear section/nonlinear section combinations.

Obviously, many modifications and variations of the invention are possible in light of the above teachings. It is therefore to be understood that within the scope of the appended claims, the invention may be practiced otherwise than as has been specifically described.

What is claimed is:

1. An apparatus comprising:
    a processor front-end including
        a source of first and second pump laser inputs;
        a signal laser wherein the signal laser generates a signal laser input, the signal laser input being modulated by a radio frequency (RF) signal to generate a RF modulated signal laser input; and
        a front-end multiplexer wherein the first and second pump laser inputs and the RF modulated signal laser input are input into the front-end multiplexer to generate a front-end multiplexed output signal containing characteristics of the first and second pump laser inputs and the RF modulated signal laser input;
    a mixer section including
        an initial mixing stage including a first non-linear section followed by a linear section, the front-end multiplexed output signal being provided as an input to the first non-linear section and being output as a third-order nonlinear process output, the third-order nonlinear process output being provided as an input to the linear section to thereby output a mixed time compressed and power enhanced signal containing characteristics of the first and second pump laser inputs and the RF modulated signal laser input; and
        a secondary mixing stage including a second nonlinear section, the mixed time compressed and power enhanced signal being input into the second nonlinear section and being replicated therein through third-order nonlinear processing to thereby output a comb of copies of the mixed time compressed and power enhanced signal having characteristics of the first and second pump laser inputs (hereafter pump laser comb of copies) and a comb of copies of the mixed time compressed and power enhanced signal having characteristics of the RF modulated signal laser input (hereafter RF modulated signal laser comb of copies); and
    a processor back-end including
        a periodic filter receiving the RF modulated signal laser comb of copies and filtering the same, the filter having a periodicity that differs from a periodicity of the RF modulated signal laser comb of copies and having a passband that is a fraction of a period of the RF modulated signal laser comb of copies, whereby the filter applies to each copy of the comb of copies of the RF modulated signal laser comb of copies thereby providing a filtered RF modulated signal laser comb of copies;
        a back-end multiplexer wherein the filtered RF modulated signal laser comb of copies are demultiplexed into individual channel outputs.

2. The apparatus of claim 1 further comprising an individual power output detector for each individual channel output, the individual power output detectors operably coupled to receive respective individual channel outputs to detect power in the individual channel output.

3. The apparatus of claim 1 further comprising an individual signal combiner for each individual channel output, the individual signal combiners operably coupled to receive respective individual channel outputs and an optical carrier signal so that individual channel information can be extracted.

4. The apparatus of claim 1 wherein the first and second laser inputs and the signal laser input are adjusted to alter a bandpass of the apparatus.

5. The apparatus of claim 1 wherein the first and second laser inputs and the signal laser input are adjusted to alter a free spectral range of the apparatus.

6. A signal processing apparatus comprising:
    a processor front-end including first and second pump lasers wherein the first and second pump lasers generate first and second pump laser inputs;
a signal laser wherein the signal laser generates a signal laser input, the signal laser input being modulated by a radio frequency (RF) signal to generate a RF modulated signal laser input; and
a dense wave division multiplexer wherein the first and second pump laser inputs and the RF modulated signal laser input are input into the dense wave division multiplexer to generate a front-end multiplexed output signal containing characteristics of the first and second pump laser inputs and the RF modulated signal laser input;
a mixer section including
an initial mixing stage including a first non-linear section followed by a linear section, the front-end multiplexed output signal being provided as an input to the first non-linear section and being output as a third-order nonlinear process output, the third-order nonlinear process output being provided as an input to the linear section to thereby output a mixed time compressed and power enhanced signal containing characteristics of the first and second pump laser inputs and the RF modulated signal laser input; and
a secondary mixing stage including a second nonlinear section, the mixed time compressed and power enhanced signal being input into the second nonlinear section wherein the mixed time compressed and power enhanced signal is replicated through third-order nonlinear processing to thereby output a comb of copies of the mixed time compressed and power enhanced signal having characteristics of the first and second pump laser inputs (hereafter pump laser comb of copies) and a comb of copies of the mixed time compressed and power enhanced signal having characteristics of the RF modulated signal laser input (hereafter RF modulated signal laser comb of copies); and
a processor back-end including
a pump filter, the pump laser comb of copies and the RF modulated signal laser comb of copies provided as inputs to the pump filter and the RF modulated signal laser comb of copies being output from the pump filter;
a single periodic filter operably coupled to the pump filter to receive the RF modulated signal laser comb of copies and filtering the same, the single periodic filter having a periodicity that differs from a periodicity of the RF modulated signal laser comb of copies and having a passband that is a fraction of a period the RF modulated signal laser comb of copies, whereby the single periodic filter applies to each copy of the RF modulated signal laser comb of copies thereby providing a filtered RF modulated signal laser comb of copies;
a dense wavelength division multiplexer wherein the filtered RF modulated signal laser comb of copies are demultiplexed into individual channel outputs.

7. The apparatus of claim 6 further comprising an individual power output detector for each individual channel output, the individual power output detectors operably coupled to receive respective individual channel outputs to detect power in the individual channel output.

8. The apparatus of claim 6 further comprising an individual signal combiner for each individual channel output, the individual signal combiners operably coupled to receive respective individual channel outputs and an optical carrier signal so that individual channel information can be extracted.

9. The apparatus of claim 6 wherein the first and second laser inputs and the signal laser input are adjusted to alter a bandpass of the apparatus.

10. The apparatus of claim 6 wherein the first and second laser inputs and the signal laser input are adjusted to alter a free spectral range of the apparatus.

11. A method for processing a signal comprising:
processing in a processor front-end including
providing first and second pump laser inputs from a source of pump laser inputs;
providing a signal laser wherein the signal laser generates a signal laser input, the signal laser input being modulated by a radio frequency (RF) signal to generate a RF modulated signal laser input; and
multiplexing in a front-end multiplexer the first and second pump laser inputs and the RF modulated signal laser input to generate a front-end multiplexed output signal containing characteristics of the first and second pump laser inputs and the RF modulated signal laser input;
signal mixing in a mixer section including
providing an initial mixing stage including a first non-linear section followed by a linear section, the front-end multiplexed output signal being provided as an input to the first non-linear section and being output as a third-order nonlinear output, the third-order nonlinear output being provided as an input to the linear section to thereby output a mixed time compressed and power enhanced signal containing characteristics of the first and second pump laser inputs and the RF modulated signal laser input; and
providing a secondary mixing stage including a second nonlinear section, the mixed time compressed and power enhanced signal being input into the second nonlinear section and being replicated therein through third-order nonlinear processing to thereby output a comb of copies of the mixed time compressed and power enhanced signal having characteristics of the first and second pump laser inputs (hereafter pump laser comb of copies) and a comb of copies of the mixed time compressed and power enhanced signal having characteristics of the RF modulated signal laser input (hereafter RF modulated signal laser comb of copies); and
processing in a processor back-end including
filtering in a periodic filter the RF modulated signal laser comb of copies, the filter having a periodicity that differs from a periodicity of the RF modulated signal laser comb of copies and having a passband that is a fraction of a period of the RF modulated signal laser comb of copies, whereby the filter is applied to each copy of the comb of copies of the RF modulated signal laser comb of copies to thereby providing a filtered RF modulated signal laser comb of copies;
demultiplexing in a back-end multiplexer wherein the filtered RF modulated signal laser comb of copies are demultiplexed into individual channel outputs.

12. The method of claim 11 further including the step of processing each individual channel output in its own individual power output detector, the individual power output detectors operably coupled to receive respective individual channel outputs to detect power in the individual channel output.

13. The method of claim 11 further including the step of processing each individual channel output in its own individual signal combiner, the individual signal combiners operably coupled to receive respective individual channel outputs and an optical carrier signal so that individual channel information can be extracted.

14. The method of claim 11 including adjusting the first and second laser inputs and the signal laser input to alter a bandpass of the apparatus.

15. The method of claim 11 including adjusting the first and second laser inputs and the signal laser input to alter a free spectral range of the apparatus.

* * * * *